(12) United States Patent
Hayashida et al.

(10) Patent No.: US 11,996,299 B2
(45) Date of Patent: May 28, 2024

(54) METHODS FOR MANUFACTURING A SEMICONDUCTOR DEVICE

(71) Applicant: Mitsubishi Electric Corporation, Tokyo (JP)

(72) Inventors: Yukimasa Hayashida, Fukuoka (JP); Isao Umezaki, Fukuoka (JP); Goro Yasutomi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 819 days.

(21) Appl. No.: 17/051,966

(22) PCT Filed: Oct. 23, 2018

(86) PCT No.: PCT/JP2018/039365
§ 371 (c)(1),
(2) Date: Oct. 30, 2020

(87) PCT Pub. No.: WO2020/084691
PCT Pub. Date: Apr. 30, 2020

(65) Prior Publication Data
US 2021/0134607 A1    May 6, 2021

(51) Int. Cl.
*H01L 23/498* (2006.01)
*H01L 21/48* (2006.01)
(Continued)

(52) U.S. Cl.
CPC .... *H01L 21/4842* (2013.01); *H01L 23/49811* (2013.01); *H01L 23/049* (2013.01);
(Continued)

(58) Field of Classification Search
CPC .......... H01L 21/4842; H01L 23/49572; H01L 24/79; H05K 13/08; H05K 13/0473; Y10T 29/49147; Y10T 29/49151
See application file for complete search history.

(56) References Cited

U.S. PATENT DOCUMENTS 4,616,412 A * 10/1986 Schroeder ......... H01L 23/49572
29/827
5,880,522 A   3/1999 Yonemoto et al.
(Continued)

FOREIGN PATENT DOCUMENTS

DE   10 2017 200 256 A1   8/2017
JP   S58-34952 A          3/1983
(Continued)

OTHER PUBLICATIONS

International Search Report; Written Opinion; and Notification of Transmittal of the International Search Report and the Written Opinion of the International Searching Authority, or the Declaration issued in PCT/JP2018/039365; dated Nov. 27, 2018.
(Continued)

*Primary Examiner* — Donghai D Nguyen
(74) *Attorney, Agent, or Firm* — Studebaker & Brackett PC

(57) ABSTRACT

A semiconductor chip (6,7) is connected to a metal pattern (5). A shear drop surface (15) of an electrode (9) is bonded to the metal pattern (5). A burr (20) is formed at an end portion of the burr surface (16) of the electrode (9). A crushing amount of the end portion of the burr surface (16) is equal to or less than 10 μm.

3 Claims, 9 Drawing Sheets

(51) Int. Cl.
- H01L 23/00 (2006.01)
- H01L 23/049 (2006.01)
- H01L 23/24 (2006.01)
- H01L 23/373 (2006.01)
- H01L 25/07 (2006.01)
- H02M 1/08 (2006.01)
- H02M 7/5387 (2007.01)
- H02P 27/08 (2006.01)

(52) U.S. Cl.
CPC .......... H01L 23/24 (2013.01); H01L 23/3735 (2013.01); H01L 24/48 (2013.01); H01L 25/072 (2013.01); H01L 2224/48137 (2013.01); H02M 1/08 (2013.01); H02M 7/53871 (2013.01); H02P 27/08 (2013.01)

(56) References Cited

U.S. PATENT DOCUMENTS

| | | | |
|---|---|---|---|
| 6,279,226 B1 * | 8/2001 | Ohkubo | ................ H01L 24/79 29/840 |
| 6,342,726 B2 | 1/2002 | Miyazaki et al. | |
| 2016/0284566 A1 | 9/2016 | Kira et al. | |
| 2017/0221853 A1 | 8/2017 | Yoneyama et al. | |
| 2017/0229320 A1 * | 8/2017 | Oohiraki | ................ C04B 37/02 |

FOREIGN PATENT DOCUMENTS

| | | |
|---|---|---|
| JP | S63-59595 A | 3/1988 |
| JP | H09-312373 A | 12/1997 |
| JP | H10-041324 A | 2/1998 |
| JP | 2013-191716 A | 9/2013 |
| JP | 2015-53425 A | 3/2015 |
| JP | 2016-184612 A | 10/2016 |

OTHER PUBLICATIONS

An Office Action; "Notice of Reasons for Refusal", mailed by the Japanese Patent Office dated Apr. 19, 2022, which corresponds to Japanese Patent Application No. 2020-551747 and is related to U.S. Appl. No. 17/051,966; with English language translation.

An Office Action issued by the German Patent and Trademark Office dated Oct. 19, 2023, which corresponds to German Patent Application No. 112018008098.6 and is related to U.S. Appl. No. 17/051,966; with English language translation.

* cited by examiner

| CRUSHING AMOUNT | APPEARANCE (MAGNIFYING GLASS) | ACTUAL MEASUREMENT OF CRUSHING AMOUNT (3D SCAN) | ULTRASONIC BONDING DEVICE CAMERA RECOGNITION IMAGE | JUDGMENT |
|---|---|---|---|---|
| LARGER THAN 10 $\mu m$ | | MEASUREMENT RESULT: 13 TO 20 $\mu m$ | MISRECOGNITION | NG |
| EQUAL TO OR LESS THAN 10 $\mu m$ | | MEASUREMENT RESULT: 7 TO 10 $\mu m$ | RECOGNITION OK | OK |

METHODS FOR MANUFACTURING A SEMICONDUCTOR DEVICE

FIELD

The present disclosure relates to a method for manufacturing a semiconductor device, a semiconductor device, a power conversion device, and a moving body wherein an electrode is bonded to a metal pattern.

BACKGROUND

Upon formation of an electrode through press punching (see, for example, PTL 1 (paragraph [0012] and FIG. 2)), a burr surface is formed on an opposite side of a sheer droop surface of the electrode. When the sheer droop surface of the electrode is ultrasonically bonded to a metal pattern, the sheer droop surface is aligned with the metal pattern by image recognition being performed with a camera of an ultrasonic bonding device while the burr surface of the electrode is illuminated.

CITATION LIST

Patent Literature

[PTL 1] JP H9-312373 A

SUMMARY

Technical Problem

There is a case where a burr is crushed as a result of the burr surface being accidentally pressed within a progressive die upon press punching. In this case, an outer circumference of an electrode in a camera image becomes blurred, which may cause misrecognition due to a shape of the electrode failing to be clearly shown in the image. This causes a problem of reduction in bonding quality of ultrasonic bonding, which leads to degradation of reliability. Further, there is also a case where a trouble such as stop of operation of a device due to a recognition error occurs. It is therefore necessary to take time for ultrasonic bonding work of an electrode and necessary for workers to always be bound up in the work. This inhibits reduction of man-hours and makes it difficult to automate the operation. As a result, there is a problem of reduction in production efficiency.

The present invention has been made to solve the problems as described above, and an object of the present invention is to provide a method for manufacturing a semiconductor device, a semiconductor device, a power conversion device, and a moving body which are capable of improving reliability and production efficiency.

Solution to Problem

A method for manufacturing a semiconductor device according to the present disclosure includes: connecting a semiconductor chip to a metal pattern; forming an electrode through press punching; and recognizing a burr surface of the electrode with a camera and pressing an ultrasonic bonding tool against the burr surface to ultrasonically bond an sheer droop surface of the electrode to the metal pattern, wherein a burr is formed at an end portion of the burr surface, and a crushing amount of the end portion of the burr surface is equal to or less than 10 μm.

Advantageous Effects of Invention

In the present disclosure, the crushing amount of the end portion of the burr surface is suppressed to equal to or less than 10 μm. This prevents misrecognition of the electrode and improves bonding quality of ultrasonic bonding. As a result, it is possible to improve reliability and production efficiency.

DESCRIPTION OF EMBODIMENTS

A method for manufacturing a semiconductor device, a semiconductor device, a power conversion device, and a moving body according to the embodiments of the present disclosure will be described with reference to the drawings. The same components will be denoted by the same symbols, and the repeated description thereof may be omitted.

First Embodiment

Figure 1:
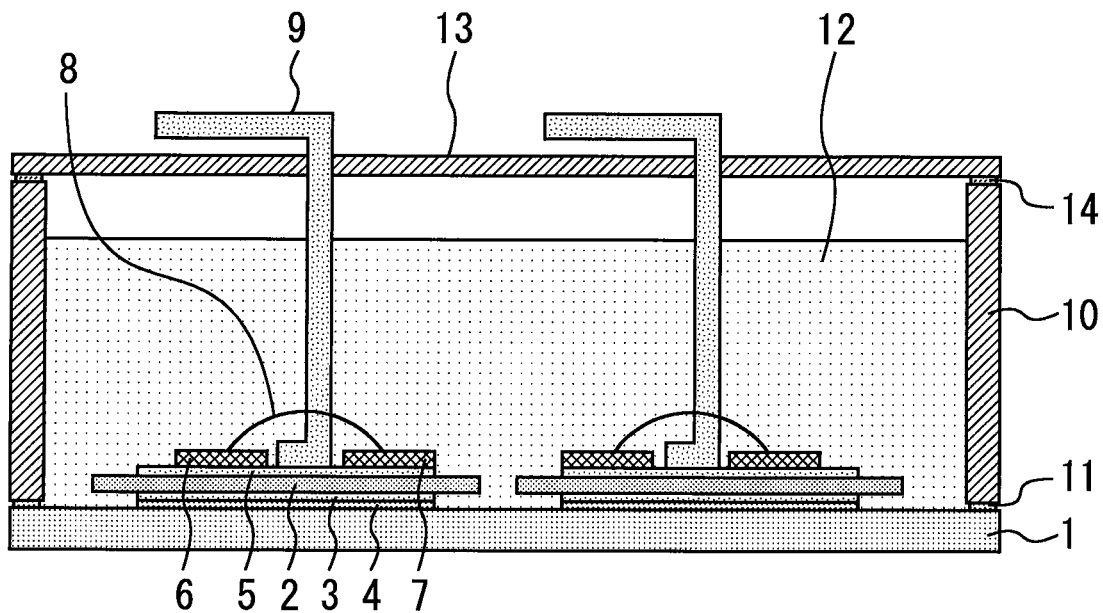
FIG. 1 is a sectional drawing illustrating a semiconductor device according to a first embodiment.

FIG. 1 is a sectional drawing illustrating a semiconductor device according to a first embodiment. A metal pattern 3 on a lower surface of an insulating substrate 2 is bonded to a heat dissipating plate 1 with a solder 4. Lower electrodes of semiconductor chips 6 and 7 are connected to a metal pattern 5 on an upper surface of the insulating substrate 2. Upper electrodes of the semiconductor chips 6 and 7 are connected to each other with a wire 8. An electrode 9 is ultrasonically bonded to the metal pattern 5. A case 10 is attached to the heat dissipating plate 1 with an adhesive agent 11 so as to surround the insulating substrate 2, the semiconductor chips 6 and 7, and the like. The insulating substrate 2, the semiconductor chips 6 and 7, and the like, are sealed with a seal material 12 within the case 10. A lid 13 is attached on a top of the case 10 with an adhesive agent 14. Part of the electrode 9 is out of the lid 13.

Figure 2:
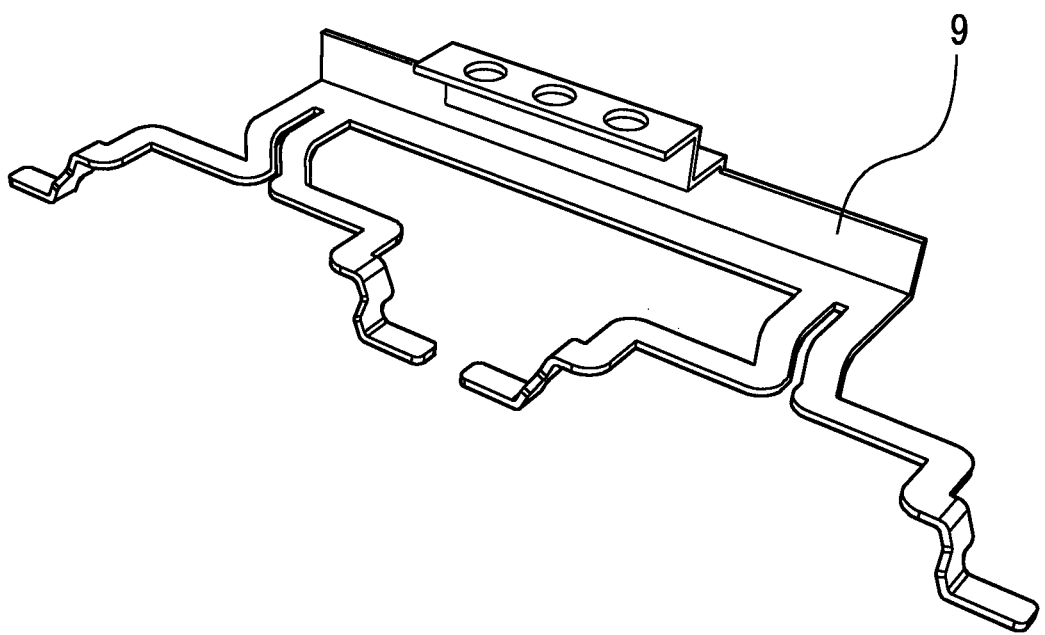
FIG. 2 is a perspective view illustrating the electrode.
Figure 3:
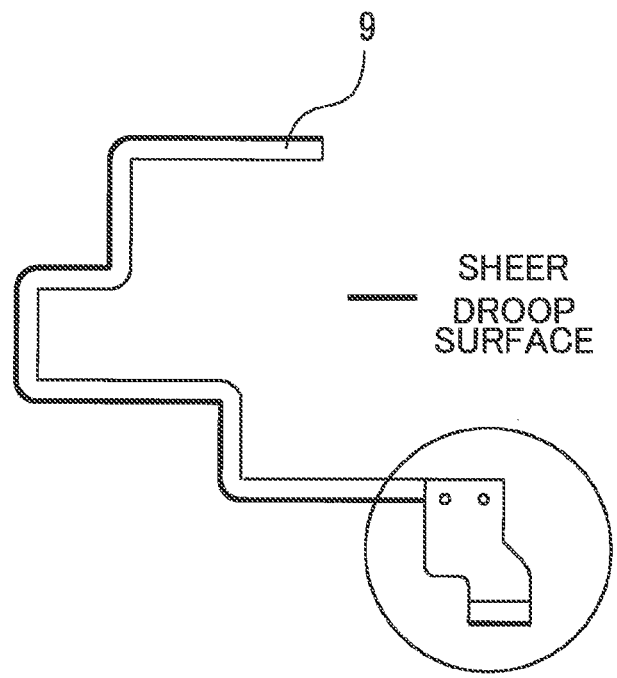
FIG. 3 is a side view illustrating the electrode.
Figure 4:
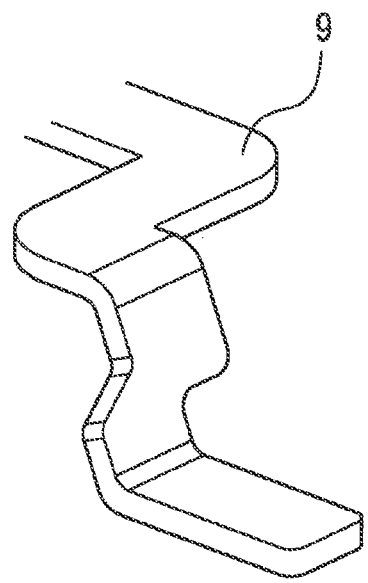
FIG. 4 is an enlarged perspective view of a portion enclosed with a circle in FIG. 3.
Figure 5:
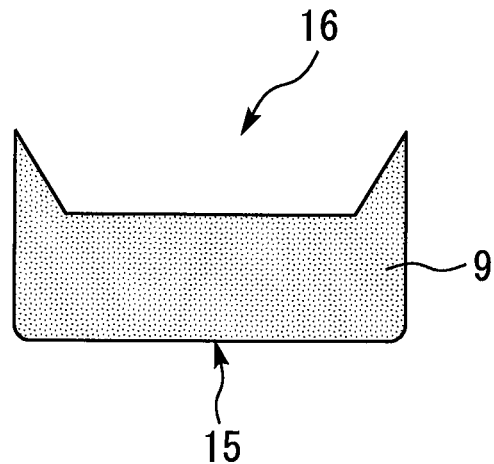
FIG. 5 is a sectional drawing of the electrode.
Figure 6:
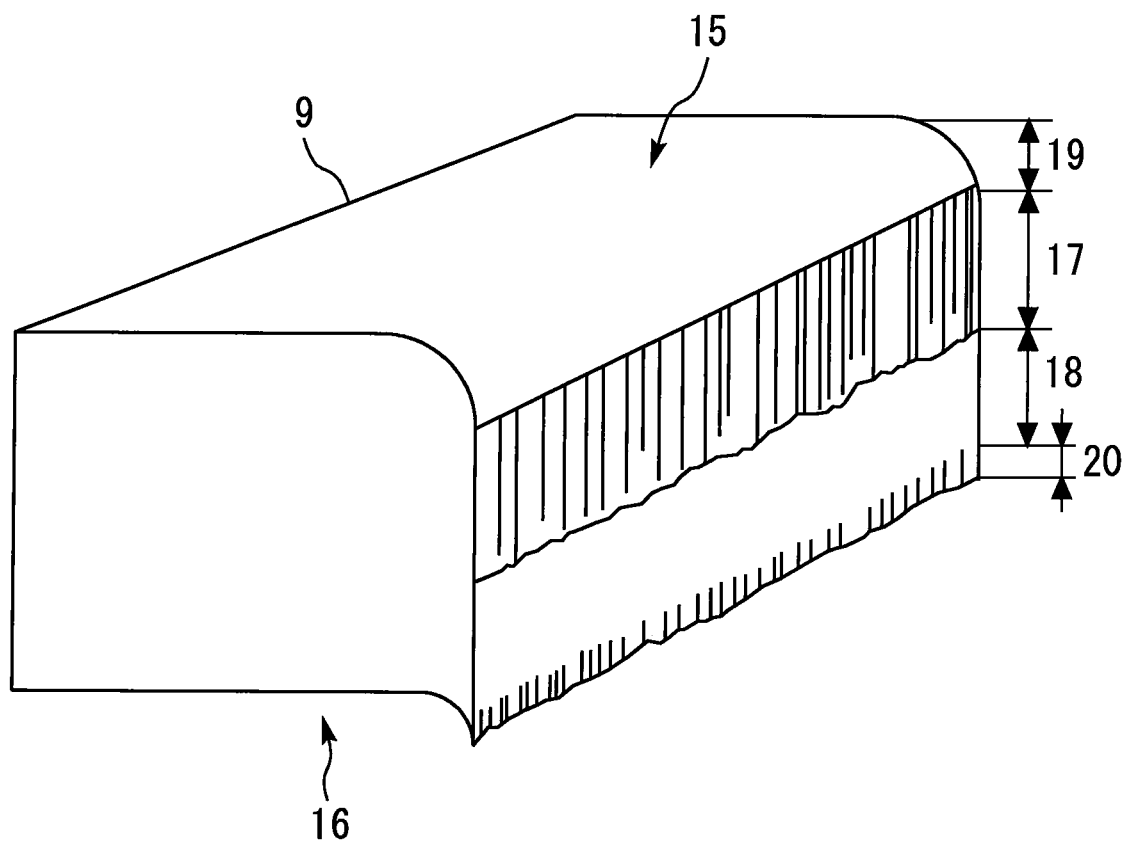
FIG. 6 is an enlarged perspective view of a cut portion of the electrode.

FIG. 2 is a perspective view illustrating the electrode. FIG. 3 is a side view illustrating the electrode. FIG. 4 is an enlarged perspective view of a portion enclosed with a circle in FIG. 3. FIG. 5 is a sectional drawing of the electrode. FIG. 6 is an enlarged perspective view of a cut portion of the electrode. The electrode 9 is formed through press punching using a progressive die. A burr surface 16 is formed on an opposite side of a sheer droop surface 15 of the electrode 9. A cut surface of the electrode 9 subjected to press punching includes a sheared portion 17 and a ruptured portion 18. A sheer droop 19 is formed at an end portion of the sheer droop surface 15. A burr 20 is formed at an end portion of the burr surface 16 of the electrode 9. The burr 20 is also referred to as a fin.

Figure 7:
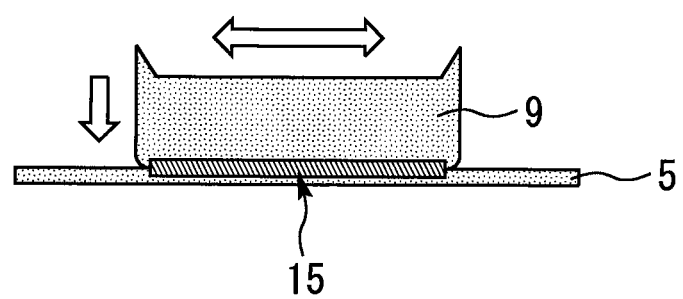
FIG. 7 is a sectional drawing illustrating an aspect where the sheer droop surface of the electrode is ultrasonically bonded to the metal pattern.
Figure 8:
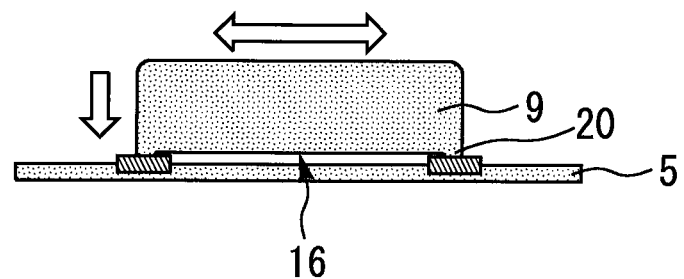
FIG. 8 is a sectional drawing illustrating an aspect where the burr surface of the electrode is ultrasonically bonded to the metal pattern.

In ultrasonic bonding, metals are brought into contact with each other, oxide films, contamination, and the like, on metal surfaces are broken down through ultrasonic vibration and amplitude, and cleaned surfaces of the metal surfaces are bonded to each other through pressurization. Bonding quality of ultrasonic bonding becomes higher as a bonding area is larger. FIG. 7 is a sectional drawing illustrating an aspect where the sheer droop surface of the electrode is ultrasonically bonded to the metal pattern. As a result of a central portion of the sheer droop surface 15 of the electrode 9 contacting the metal pattern 5, the bonding area becomes larger. FIG. 8 is a sectional drawing illustrating an aspect where the burr surface of the electrode is ultrasonically bonded to the metal pattern. The bonding area becomes smaller because only a portion of the burr 20 is bonded to the metal pattern 5. Therefore, in the present embodiment, the sheer droop surface 15 of the electrode 9 is ultrasonically bonded to the metal pattern 5.

Figure 9:
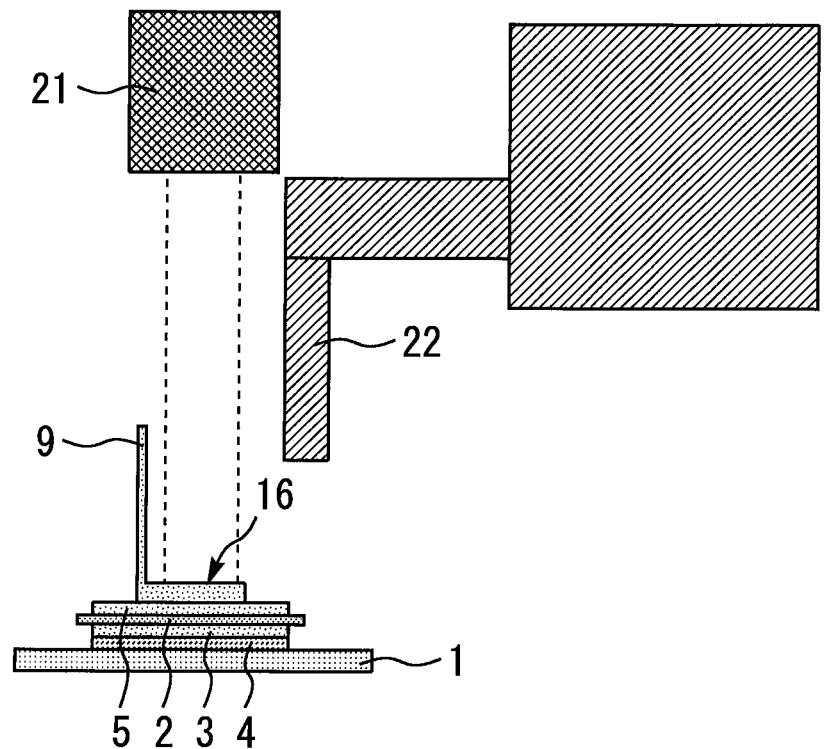
FIG. 9 is a sectional drawing illustrating process of manufacturing the semiconductor device according to the first embodiment.
Figure 10:
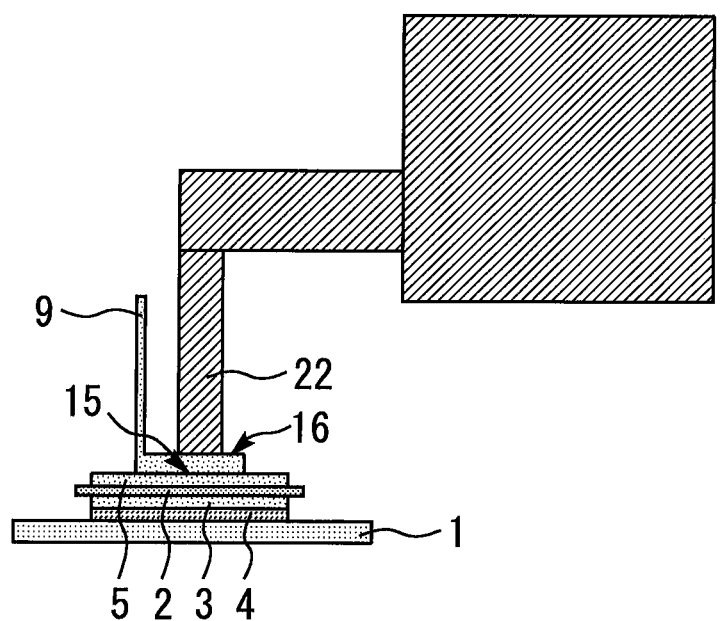
FIG. 10 is a sectional drawing illustrating process of manufacturing the semiconductor device according to the first embodiment.

Subsequently, a method for manufacturing a semiconductor device according to the present embodiment will be described. FIG. 9 and FIG. 10 are sectional drawings illustrating process of manufacturing the semiconductor device according to the first embodiment. The semiconductor chips 6 and 7 are connected to the metal pattern 5 of the insulating substrate 2. The electrode 9 is formed through press punching. Then, as illustrated in FIG. 9, the burr surface 16 of the electrode 9 is illuminated, and the burr surface 16 is recognized from an image with a camera 21 of the ultrasonic bonding device to perform alignment. Then, as illustrated in FIG. 10, an ultrasonic bonding tool 22 is pressed against the burr surface 16 of the electrode 9 so that the sheer droop surface 15 of the electrode 9 is ultrasonically bonded to the metal pattern 5.

Here, if the electrode 9 is subjected to press punching, the burr 20 is formed at the whole cut end portion of the electrode 9. As the stage proceeds, the burr 20 is crushed several times with a stripper plate and a die plate. As a result, most part of the burr 20 is crushed, and the end portion of the burr surface 16 is dented by several micrometers. If a crushing amount of the end portion of the burr surface 16 is large, an outer circumference of the electrode 9 becomes blurred in a camera image, which causes misrecognition due to the shape of the electrode 9 failing to be clearly shown in the image, and causes a trouble in bonding process. Here, the crushing amount is a difference in height between a flat surface of the central portion of the burr surface 16 and a bottom of a crushed portion of the end portion of the burr surface 16.

Figure 11:
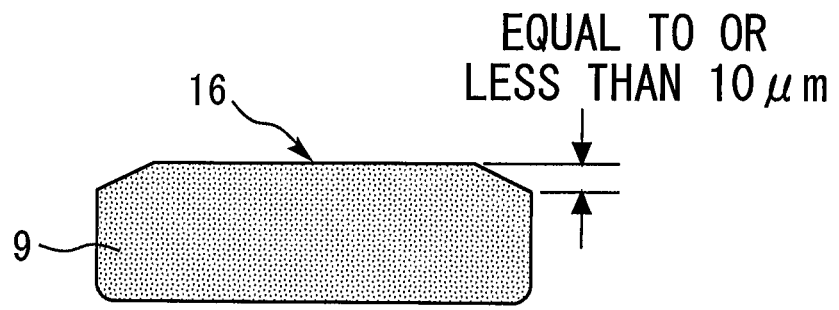
FIG. 11 is a sectional drawing illustrating an electrode in which the crushing amount of the end portion of the burr surface is equal to or less than 10 μm.
Figure 12:
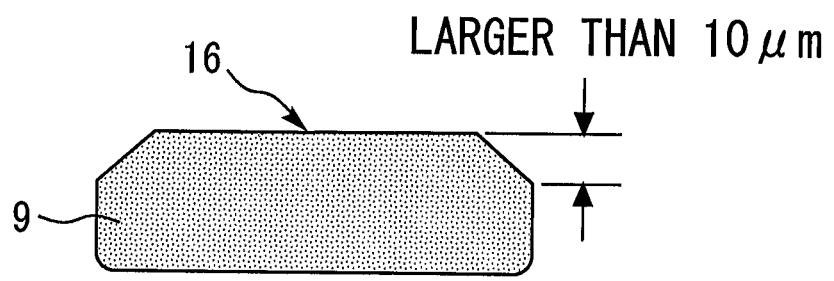
FIG. 12 is a sectional drawing illustrating an electrode in which the crushing amount of the end portion of the burr surface is larger than 10 μm.
Figures 13, 14:
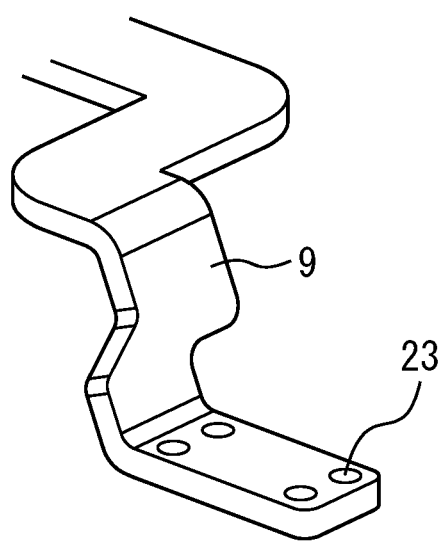
FIG. 13 is a drawing illustrating experimental data obtained by examining the crushing amount of the end portion of the burr surface and whether or not recognition by the camera is successful.
FIG. 14 is a perspective view illustrating an electrode of a semiconductor device according to a second embodiment.

FIG. 11 is a sectional drawing illustrating an electrode in which the crushing amount of the end portion of the burr surface is equal to or less than 10 µm. FIG. 12 is a sectional drawing illustrating an electrode in which the crushing amount of the end portion of the burr surface is larger than 10 µm. FIG. 13 is a drawing illustrating experimental data obtained by examining the crushing amount of the end portion of the burr surface and whether or not recognition by the camera is successful. Misrecognition occurs in a case where the crushing amount of the end portion of the burr surface 16 is from 13 to 20 µm, while the electrode 9 can be correctly recognized in a case where the crushing amount is from 7 to 10 µm. Therefore, in the present embodiment, the crushing amount of the end portion of the burr surface 16 is suppressed to equal to or less than 10 µm by optimizing stroke amount and speed of a press in press pinching process of the electrode 9. This prevents misrecognition of the electrode 9 and improves bonding quality of ultrasonic bonding. As a result, it is possible to improve reliability and production efficiency.

Second Embodiment

FIG. 14 is a perspective view illustrating an electrode of a semiconductor device according to a second embodiment. In the present embodiment, marking shapes 23 which can be recognized with a camera are provided at corner portions, for example, four corners or two diagonal corners of the burr surface 16 of the electrode 9 against which the ultrasonic bonding tool 22 is to be pressed. The marking shapes 23 are circular dents formed through half etching, or the like. As a result of such physical dents being formed, visibility of the electrode 9 and camera recognition accuracy are further improved, and thus bonding quality and production efficiency are further improved.

It can be confirmed, in an actual image of the burr surface 16 of the electrode 9 subjected to ultrasonic bonding, that the burr 20 and the marking shapes 23 are partially deformed by being hit by the ultrasonic bonding tool 22 but remain identifiable even after bonding.

Note that the marking shapes 23 may be formed through machining such as punching or may have a conical shape, a pyramid shape, or the like. The marking shapes 23 which are formed through machining, are clear, and further improve visibility of the electrode 9 and the camera recognition accuracy. Further, quantitative management becomes possible.

Third Embodiment

Figure 15:
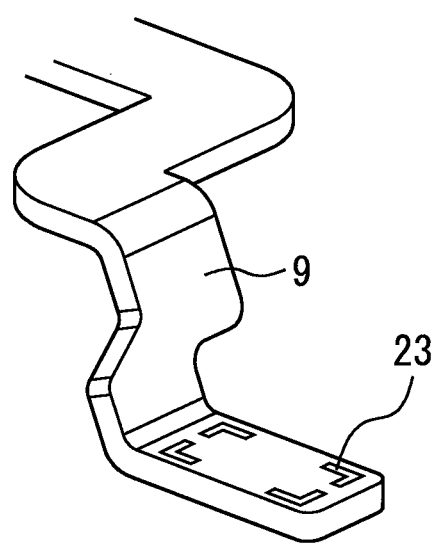
FIG. 15 is a perspective view illustrating an electrode of a semiconductor device according to a third embodiment.

FIG. 15 is a perspective view illustrating an electrode of a semiconductor device according to a third embodiment. In the present embodiment, the marking shapes 23 have an L shape. The marking shapes 23 are grooves of approximately 0.5 mm in depth and are formed through machining. The L-shaped marking shapes 23 further improve visibility of the electrode 9 and the camera recognition accuracy.

In the first to the third embodiments, the semiconductor chips 6 and 7 are IGBTs, MOSFETs, diodes, SBDs, or the like, formed with silicon. However, the semiconductor chips 6 and 7 are not limited to those formed with silicon, and may be formed with a wide band gap semiconductor having a wider band gap than that of silicon. The wide band gap semiconductor is, for example, silicon carbide, a gallium nitride based material or diamond. A power semiconductor device formed with such a wide band gap semiconductor has high withstand voltage and high allowable current density, and thus can be made smaller. Use of this device which is made smaller can also achieve reduction in size of a semiconductor module in which the device is incorporated. Further, high heat resistance of the device enables reduction in size of radiating fins of a heat sink, and allows employment of air cooling in place of a water cooling portion, so that it is possible to make the semiconductor module smaller. Moreover, low power loss and high efficiency of the device enables the semiconductor module to be more efficient. Additionally, the semiconductor device according to the present embodiment can stably secure ultrasonic bonding life of the electrode 9 even in a case of use in a high temperature environment.

Fourth Embodiment

In this embodiment, the semiconductor devices according to the first to third embodiments described above are applied to an electric power conversion device. The electric power conversion device is, for example, an inverter device, a converter device, a servo amplifier, or a power supply unit. Although the present disclosure is not limited to a specific electric power conversion device, a case where the present disclosure is applied to a three-phase inverter will be described below.

Figure 16:
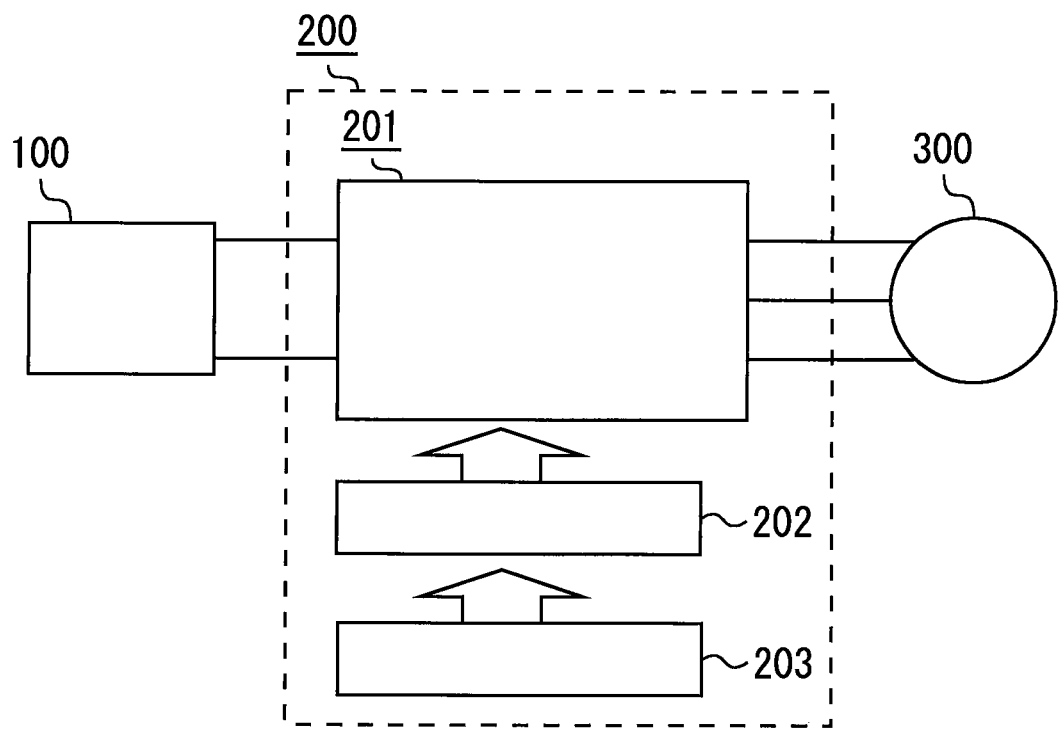
FIG. 16 is a block diagram illustrating a configuration of an electric power conversion system to which the electric power conversion device according to the fourth embodiment is applied.

FIG. 16 is a block diagram illustrating a configuration of an electric power conversion system to which the electric power conversion device according to the fourth embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, a drive circuit 202 that outputs a drive signal for driving each switching device of the main conversion circuit 201, and a control circuit 203 that outputs a control signal for controlling the drive circuit 202 to the drive circuit 202.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device of the main conversion circuit 201 is composed of the semiconductor device corresponding to any one of the first to third embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

The drive circuit 202 generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit 202 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, each switching device of the main conversion circuit 201 is configured by the semiconductor device according to any one of the above-described first to third embodiments. As a result, reliability and production efficiency can be improved.

While this embodiment illustrates an example in which the present disclosure is applied to a two-level three-phase inverter, the present disclosure is not limited to this and can be applied to various electric power conversion devices. While this embodiment illustrates a two-level electric power conversion device, the present disclosure can also be applied to a three-level or multi-level electric power conversion device. When power is supplied to a single-phase load, the present disclosure may be applied to a single-phase inverter. The present disclosure can also be applied to a DC/DC converter or an AC/DC converter when power is supplied to a DC load or the like.

Further, in the electric power conversion device to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

Fifth Embodiment

Figure 17:
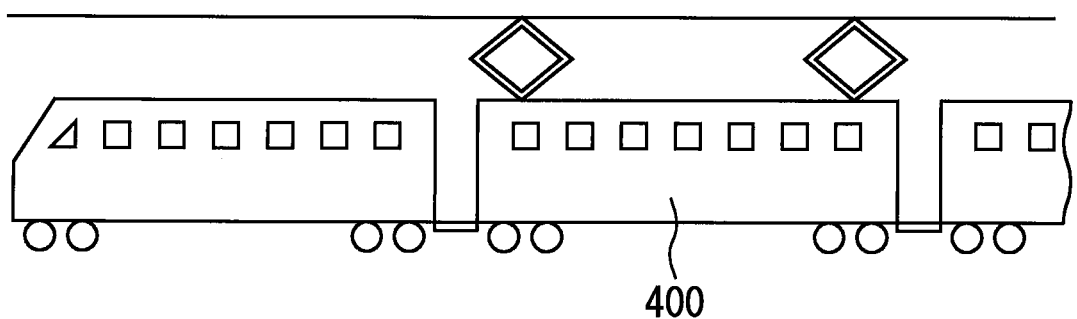
FIG. 17 is a drawing illustrating a moving body according to a fifth embodiment.

FIG. 17 is a drawing illustrating a moving body according to a fifth embodiment. This moving body 400 is a train, or the like, and controls power using the power conversion device 200 according to the fourth embodiment. It is thereby possible to improve reliability and production efficiency.

REFERENCE SIGNS LIST 5 metal pattern; 6, 7 semiconductor chip; 9 electrode; 15 sheer droop surface; 16 burr surface; 20 burr; 21 camera; 22 ultrasonic bonding tool; 23 marking shape; 200 power conversion device; 201 main conversion circuit; 202 drive circuit; 203 control circuit; 400 moving body

The invention claimed is:

1. A method for manufacturing a semiconductor device comprising:
   connecting a semiconductor chip to a metal pattern;
   forming an electrode through press punching; and
   recognizing a burr surface of the electrode with a camera and pressing an ultrasonic bonding tool against the burr surface to ultrasonically bond a sheer droop surface of the electrode to the metal pattern,
   wherein a burr is formed at an end portion of the burr surface, and
   a crushing amount of the end portion of the burr surface is equal to or less than 10 μm.

2. A method for manufacturing a semiconductor device comprising:
   connecting a semiconductor chip to a metal pattern;
   forming an electrode through press punching;
   forming a marking shape at a corner portion of a burr surface of the electrode; and
   recognizing the burr surface having the marking shape with a camera and pressing an ultrasonic bonding tool against the burr surface to ultrasonically bond a sheer droop surface of the electrode to the metal pattern, wherein
   a burr is formed at an end portion of the burr surface and a crushing amount of an end portion of the burr surface is equal to or less than 10 μm.

3. The method for manufacturing a semiconductor device according to claim 2, wherein the marking shape is formed through machining.

* * * * *